United States Patent
Ozaki

(10) Patent No.: US 10,638,607 B2
(45) Date of Patent: Apr. 28, 2020

(54) CONDUCTOR CONNECTION STRUCTURE FOR PLATE-LIKE ROUTING MEMBERS

(71) Applicant: YAZAKI CORPORATION, Tokyo (JP)

(72) Inventor: Masahito Ozaki, Shizuoka (JP)

(73) Assignee: YAZAKI CORPORATION, Tokyo (JP)

( * ) Notice: Subject to any disclaimer, the term of this patent is extended or adjusted under 35 U.S.C. 154(b) by 0 days.

(21) Appl. No.: 16/129,596

(22) Filed: Sep. 12, 2018

(65) Prior Publication Data

US 2019/0082537 A1    Mar. 14, 2019

(30) Foreign Application Priority Data

Sep. 13, 2017    (JP) .................. 2017-175765

(51) Int. Cl.
*H05K 1/14*    (2006.01)
*H02G 3/08*    (2006.01)
(Continued)

(52) U.S. Cl.
CPC ......... *H05K 1/144* (2013.01); *B60R 16/0238* (2013.01); *H02G 3/08* (2013.01); *H05K 3/4046* (2013.01); *H05K 1/141* (2013.01); *H05K 2201/041* (2013.01); *H05K 2201/042* (2013.01); *H05K 2201/09754* (2013.01);
(Continued)

(58) Field of Classification Search
CPC ............ H05K 1/144; H05K 3/4046; H05K 2201/1028; H05K 2201/10242; H05K 2201/10295; H05K 2201/09754; H05K 1/141; H05K 2201/041; H05K 2201/10303; H05K 2201/042; H02G 3/08; B60R 16/0238; H01R 12/771; H01R 12/79;
(Continued)

(56) References Cited

U.S. PATENT DOCUMENTS 3,462,540 A * 8/1969 Harris, Jr. .............. H05K 1/144
174/254
5,575,686 A * 11/1996 Noschese ............... H01R 23/68
327/262
(Continued)

FOREIGN PATENT DOCUMENTS

JP    63-111770 U    7/1988
JP    9-199537 A    7/1997
(Continued)

*Primary Examiner* — Abhishek M Rathod
(74) *Attorney, Agent, or Firm* — Kenealy Vaidya LLP

(57) ABSTRACT

A conductor connection structure for a plurality of plate-like routing members includes the plurality of plate-like routing members, a plurality of terminal members, and a circuit board. Each of the plurality of plate-like routing members has a conductor exposed part in which a strip flat conductor is exposed, at a part of an insulating coating member coating an outer circumferential surface of the strip flat conductor. Each of the plurality of terminal members has a board connecting part connected to the conductor exposed part so as to be conducted to the strip flat conductor. The circuit board includes a plurality of circuit conductors, and terminal connecting parts on the plurality of circuit conductors are respectively electrically connected to the board connecting parts.

5 Claims, 8 Drawing Sheets

(51) Int. Cl.
 *B60R 16/023* (2006.01)
 *H05K 3/40* (2006.01)
(52) U.S. Cl.
 CPC ............. *H05K 2201/1028* (2013.01); *H05K 2201/10242* (2013.01); *H05K 2201/10295* (2013.01); *H05K 2201/10303* (2013.01)
(58) Field of Classification Search
 CPC ........ H01R 12/81; H01R 13/02; H01R 13/40; H01R 13/665
 See application file for complete search history.

(56) References Cited

U.S. PATENT DOCUMENTS

| | | | | |
|---|---|---|---|---|
| 5,761,050 A * | 6/1998 | Archer | ................ | H01R 12/585 361/744 |
| 6,000,559 A * | 12/1999 | Stopyra | ................ | H05K 7/1417 211/41.17 |
| 6,333,855 B2 * | 12/2001 | Prabaonnaud | ......... | H05K 7/142 174/138 G |
| 6,344,972 B2 * | 2/2002 | Estieule | ................... | H01R 4/64 361/753 |
| 6,817,870 B1 * | 11/2004 | Kwong | ................. | H05K 3/368 409/66 |
| 8,929,093 B2 * | 1/2015 | Yamamoto | ............. | H05K 1/144 174/255 |
| 2008/0227311 A1 * | 9/2008 | Chan | .................... | H05K 1/0216 439/74 |
| 2011/0256749 A1 * | 10/2011 | Bayerer | ............. | H01R 12/585 439/345 |
| 2012/0169257 A1 * | 7/2012 | Brereton | ............. | H05K 7/1432 318/139 |
| 2014/0198467 A1 | 7/2014 | Shi | | |
| 2017/0118858 A1 * | 4/2017 | Cheng | ................... | H05K 1/141 |

FOREIGN PATENT DOCUMENTS

| | | |
|---|---|---|
| JP | 2009-289550 A | 12/2009 |
| JP | 2014-138518 A | 7/2014 |

* cited by examiner

CONDUCTOR CONNECTION STRUCTURE FOR PLATE-LIKE ROUTING MEMBERS

CROSS REFERENCE TO RELATED APPLICATIONS

This application claims priority from Japanese Patent Application No. 2017-175765 filed on Sep. 13, 2017, the entire contents of which are incorporated herein by reference.

BACKGROUND OF THE INVENTION

Field of the Invention

The present invention relates to a conductor connection structure for plate-like routing members.

Description of Related Art

A division joint box and an electric connection box used for connecting wires routed in a vehicle are known. In wire connection structures using these boxes, the box includes connector fitting parts, and connectors of terminals of the wires drawn out (branched) from wire harness trunk lines are connected to the box. That is, the connectors are necessarily required for connection between the wire harness trunk lines and the box.
[Patent Literature 1] JP-A-2009-289550
[Patent Literature 2] JP-A-2014-138518

However, since the connectors, each of which is made up of a terminal or a housing, should be prepared for the connection between the wire harness trunk lines and the box, the number of components increases. In addition, complicated work for which many man-hours are required, such as work of press-bonding the terminals to wire terminals of the wire harness trunk lines and assembling them to the housing, should also be performed.

SUMMARY

One or more embodiments provide a conductor connection structure for plate-like routing members in which there is no need to prepare connectors and which can reduce the number of components.

In an aspect (1), one or more embodiments provide a conductor connection structure for a plurality of plate-like routing members including the plurality of plate-like routing members, a plurality of terminal members, and a circuit board. Each of the plurality of plate-like routing members has a conductor exposed part in which a strip flat conductor is exposed, at a part of an insulating coating member coating an outer circumferential surface of the strip flat conductor. Each of the plurality of terminal members has a board connecting part connected to the conductor exposed part so as to be conducted to the strip flat conductor. The circuit board includes a plurality of circuit conductors, and terminal connecting parts on the plurality of circuit conductors are respectively electrically connected to the board connecting parts.

According to the aspect (1), the terminal members are connected to the conductor exposed parts formed in the plate-like routing members. The board connecting part is provided on each of the terminal members. The board connecting parts are electrically connected with the flat conductors of the plate-like routing members. Meanwhile, the circuit conductors are formed on the circuit board by printing or the like. The terminal connecting parts that can be electrically connected to the board connecting parts are provided on the circuit conductors. In the plate-like routing members, the connected terminal members are connected to the terminal connecting parts of the circuit board, and thereby the flat conductors are connected to the circuit conductors via the board connecting parts and the terminal connecting parts. Therefore, the plate-like routing members (for example, wire harness trunk lines) and the circuit board (for example, a circuit board housed in a box) can be directly connected without preparing the connectors as in the related art. Thereby, the board connecting parts of the terminal members only need to be electrically connected to the terminal connecting parts of the circuit board by inserting the plate-like routing members to which the terminal members are connected into the box. As a result, in comparison with the connection structure using connectors in the related art, the number of components can be considerably reduced. Unlike the connection structure using connectors in the related art, complicated work for which many man-hours are required, such as work of press-bonding a plurality of terminals to wire terminals and assembling these terminals to a housing, is not necessarily performed.

In an aspect (2), the plurality of plate-like routing members are stacked. A terminal through-hole penetrated in a plate thickness direction is drilled in one of the plurality of plate-like routing members disposed at an upper layer. The terminal member connected to another of the plurality of plate-like routing members disposed at a lower layer passes through the terminal through-hole and is electrically connected to one of the terminal connecting parts so that the plurality of plate-like routing member are electrically connected via the circuit board.

According to the aspect (2), even when the plurality of plate-like routing members are stacked, the terminal member connected to the plate-like routing member at the lower layer passes through the terminal through-hole provided in the plate-like routing member at the upper layer. Thus, the terminal connecting part at the lower layer can be exposed to a surface of the plate-like routing member at the uppermost layer. As a result, a plurality of circuits can be electrically connected without changing a dimension of each of the plate-like routing members in a width direction. By using the plate-like routing member in which the terminal through-hole is previously drilled at a predetermined position, the plurality of terminal members can be disposed at predetermined positions only by overlapping the plurality of plate-like routing members. As a result, work of connecting the plurality of plate-like routing members to the circuit board is simply performed.

In an aspect (3), each of the plurality of terminal members includes a columnar terminal main body which has a conductor connecting face in an axial direction connected to the conductor exposed part. An outer circumferential surface of each of the plurality of terminal main body is coated with the insulating coating member.

According to the aspect (3), the terminal main body of each of the terminal members is formed in a columnar shape. Each of the terminal members can be rotated about an axis. One end face of the terminal member in an axial direction serves as the conductor connecting face. With this configuration, the terminal member is held, for instance, by a chuck or the like, and is rotated about the axis, and thereby, the conductor connecting face of the terminal member can be well friction-welded to the conductor exposed part. Since the outer circumferential surface of the terminal member is coated with the insulating coating member, the terminal member is merely inserted into the terminal through-hole when stacking the plate-like routing members without performing a separate insulating process, so that the contact (conduction) with the flat conductor of the plate-like routing member at the upper layer can be prevented.

According to one or more embodiments, in the conductor connection structure for plate-like routing members, there is no need to prepare connectors, and the number of components can be reduced.

One or more embodiments has been briefly described. Further, a mode described below is read through with reference to the attached drawings, and thereby details of the invention will be further clarified.

DETAILED DESCRIPTION

Hereinafter, an embodiment according to the invention will be described with reference to the drawings.

Figure 1:
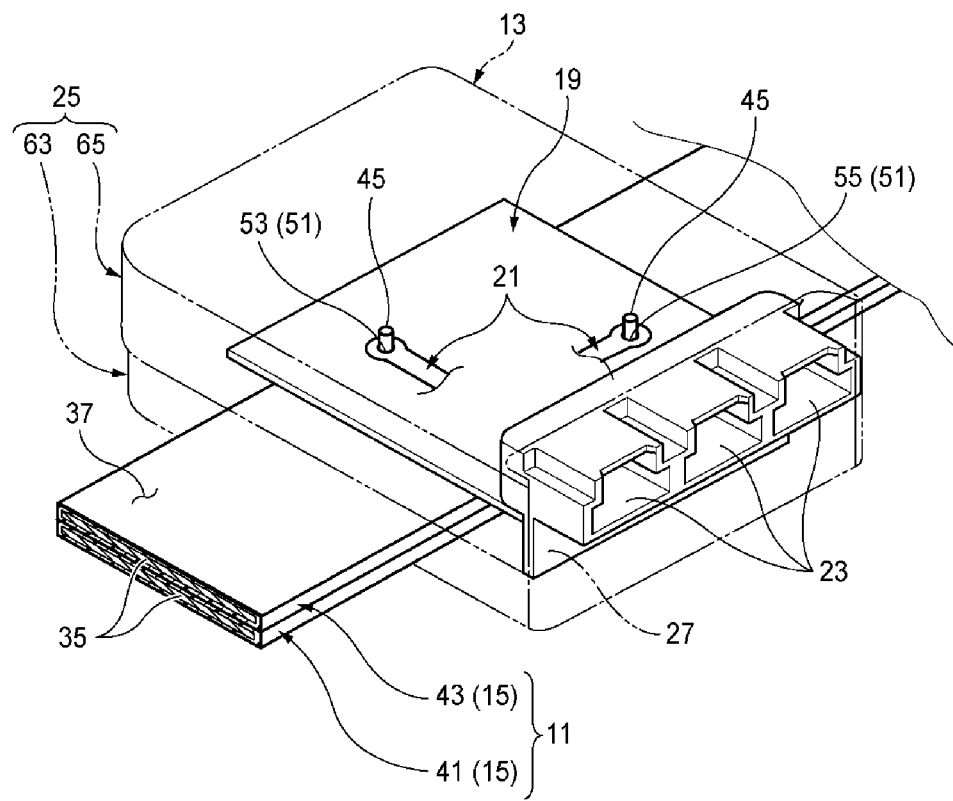
FIG. 1 is a perspective view of a stacked routing body and a branch box which include a conductor connection structure for plate-like routing members according to an embodiment of the invention.
Figure 2:
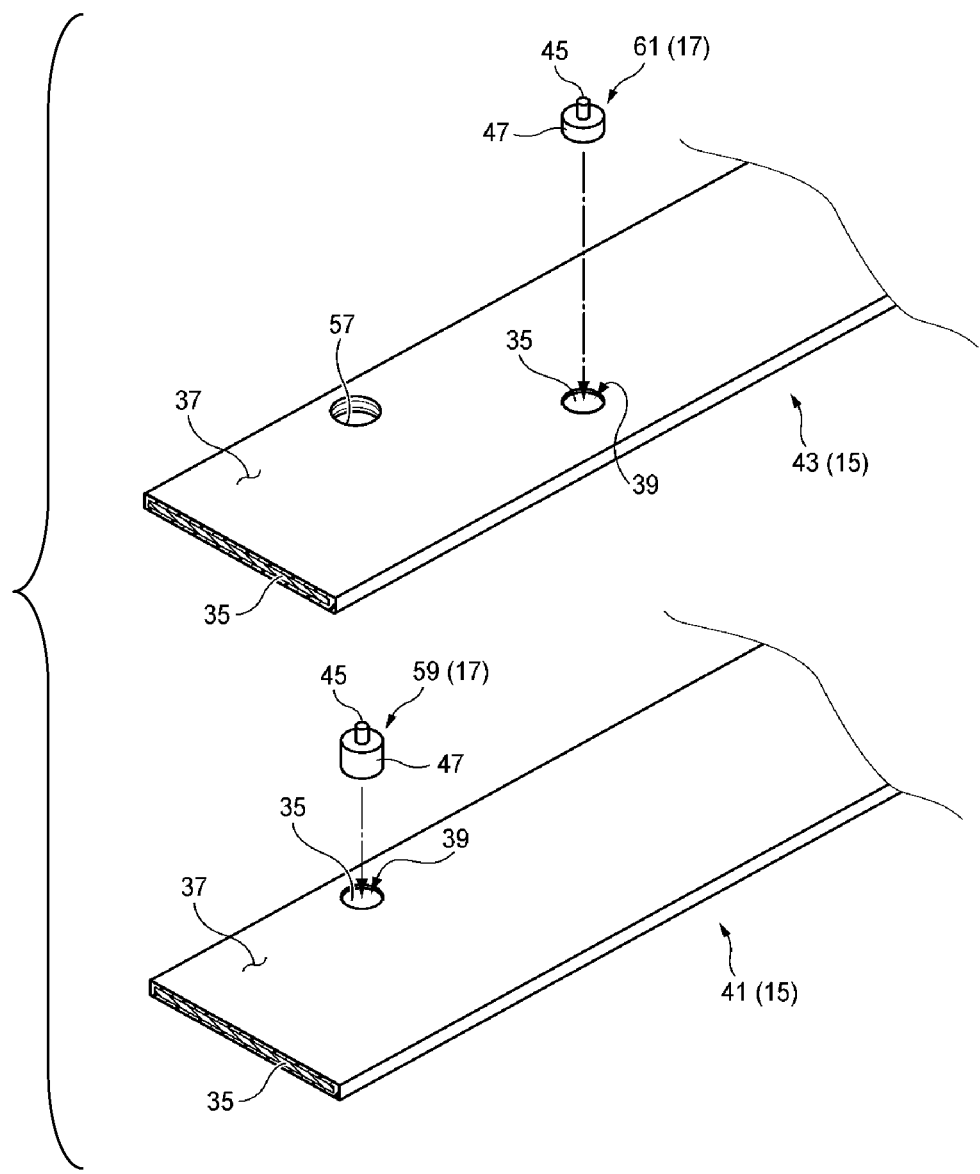
FIG. 2 is an exploded perspective view of the stacked routing body illustrated in FIG. 1.

FIG. 1 is a perspective view of a stacked routing body 11 and a branch box 13 that include a conductor connection structure for plate-like routing members according to an embodiment of the invention, and FIG. 2 is an exploded perspective view of the stacked routing body 11 illustrated in FIG. 1.

A conductor connection structure for plate-like routing members according to the present embodiment includes plate-like routing members 15, terminal members 17, and a circuit board 19 as main components.

In the present embodiment, the circuit board 19 is housed in the branch box 13. Circuit conductors 21 are printed on the circuit board 19. A plurality of edge conductors 23 conducted with a predetermined circuit for the circuit conductors 21 is mounted on one edge of the circuit board 19. The circuit board 19 is fixed at a predetermined position of the branch box 13, so that the edge conductors 23 is disposed in a connector lead-out opening 27 formed in a box housing 25 of the branch box 13. In the branch box 13, an auxiliary machine side wire 29 (see FIGS. 8A and 8B) drawn out from, for instance, an external auxiliary machine is mounted on the edge conductor 23. In the branch box 13, an auxiliary machine side connector 31 (see FIGS. 8A and 8B) is fitted to the edge conductor 23, and the circuit board 19 is electrically connected to the auxiliary machine.

The plate-like routing members 15 are arranged to pass through the branch box 13, and are electrically connected to the circuit board 19. For this reason, at least one pair of routing member lead-out openings 33 (see FIGS. 8A and 8B), from which the plate-like routing members 15 are drawn out, are formed in opposite lateral surfaces of the box housing 25.

Each of the plate-like routing members 15 includes a strip flat conductor 35. An outer circumferential surface of the flat conductor 35 is coated with an insulating coating member 37. Aluminum, an aluminum alloy, copper, a copper alloy, or the like is appropriately used for the flat conductor 35. The flat conductor 35 is formed, for instance, in a thin belt shape, and a cross-sectional shape thereof perpendicular to a longitudinal direction is a rectangular shape. In this case, the outer circumferential surface of the flat conductor 35 is an outer circumferential surface in which upper and lower surfaces and left and right lateral surfaces excluding both end faces in a longitudinal direction are continuous. In the plate-like routing members 15, a direction perpendicular to the longitudinal direction is a width direction, and a stacking direction is a thickness direction. Each of the plate-like routing members 15 is formed such that a width dimension is very larger than a thickness.

As illustrated in FIG. 2, each of the plate-like routing members 15 includes a conductor exposed part 39 from which the flat conductor 35 is exposed by removing a part of the insulating coating member 37 on one surface (the upper surface in the figure) thereof. The conductor exposed part 39 is formed, for instance, in a circular shape. Therefore, the flat conductor 35 is exposed to a surface of the insulating coating member 37 in a circular shape. At least one conductor exposed part 39 is formed at each of the plate-like routing members 15 connected to the circuit board 19. That is, a plurality of conductor exposed parts 39 may be formed at each of the plate-like routing members 15.

A plurality of plate-like routing members 15 can be stacked. Of course, one of the plate-like routing members 15 may be arranged to pass through the branch box 13, and be electrically connected to the circuit board 19. The plurality of plate-like routing members 15 are stacked via the insulating coating member 37, thereby constituting the stacked routing body 11 made up of a plurality of independent circuits corresponding to the stacked number. The stacked number of the plate-like routing members 15 is not particularly limited. That is, the stacked routing body 11 may be two layers as in the shown example, or may be three or four layers. In the present embodiment, a first layer plate-like routing member 41 and a second layer plate-like routing member 43 are stacked from below, and constitute the two-layered stacked routing body 11.

The stacked routing body 11 can be configured, for instance, as two, three, or four circuits by stacking the plurality of plate-like routing members 15. In the case of the two circuits of the present configuration example, a lower layer can be used as a ground, and an upper layer can be used as a power supply. In the case of the three circuits, a lower layer can be used as a power supply, a middle layer can be used as a ground, and an upper layer can be used as a signal.

In the case of the four circuits, layers can be set from a lower layer, for instance, in the order of a negative of 48 V, a positive of 48 V, a positive of 12 V, and a negative of 12 V. Like this stacked example, a second layer plate-like routing members 15 and a third layer plate-like routing members 15 that adjoin each other are preferably used as the same polarities. The second layer plate-like routing members 15 is set as the "positive of 48 V," and the third layer plate-like routing members 15 is set as the "positive of 12 V." In this way, the same polarities are adjoined and disposed, and thereby the stacked routing body 11 stacked with multiple circuits can suppress, for instance, crosstalk by which noise of a layer for a power system is transmitted to a layer for a signal system, and improve noise resistance performance.

The insulating coating member 37 can use an arbitrary insulating material as long as it electrically insulates the flat conductor 35 of each of the plate-like routing members 15. The insulating coating member 37 can be formed on the outer circumferential surface of the flat conductor 35 by powder coating. The powder coating mainly includes two methods of "electrostatic coating (spray coating)" and "fluidized bed coating (dip coating)." The insulating coating member 37 may be formed by any of these powder coatings. The plurality of plate-like routing members 15 are stacked after the insulating coating member 37 is formed by the powder coating.

Figure 3:
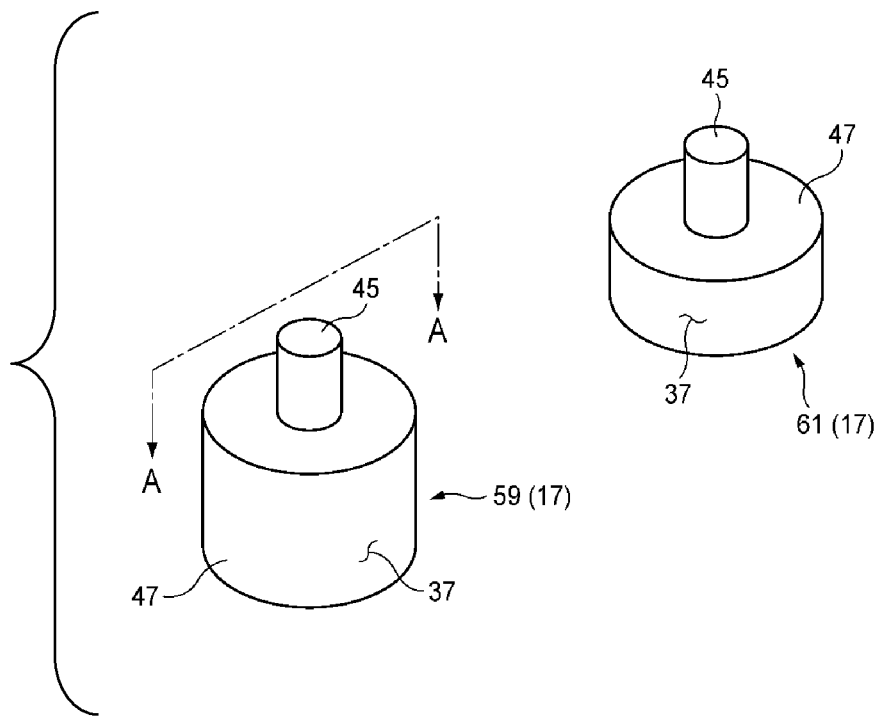
FIG. 3 is a perspective view of terminal members illustrated in FIG. 2.
Figure 4:
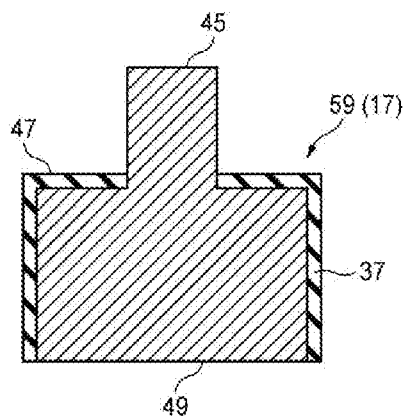
FIG. 4 is a sectional view taken along line A-A of FIG. 3.

FIG. 3 is a perspective view of the terminal members 17 illustrated in FIG. 2, and FIG. 4 is a sectional view taken along line A-A of FIG. 3.

As illustrated in FIG. 3, each of the terminal members 17 includes a board connecting part 45 formed by an electrical contact part having a columnar shape (a pin shape). That is, in the present embodiment, the terminal members 17 are male terminals. The board connecting part 45 is coaxially formed on an upper end face of a columnar terminal main body 47 that has a larger diameter than the board connecting part 45. In the terminal members 17, a lower end face of the terminal main body 47 is connected to the conductor exposed part 39 of the plate-like routing member 15. The terminal member 17 in which the terminal main body 47 is connected to the conductor exposed part 39 is conducted to the flat conductor 35 of the plate-like routing member 15.

As illustrated in FIG. 4, each of the terminal members 17 includes the columnar terminal main body 47, and a conductor connecting face 49 formed on the lower end face (one end face) of the terminal main body 47 in an axial direction is connected with the conductor exposed part 39. The terminal members 17 can be made by drawing or the like.

In the terminal members 17, the conductor connecting face 49 is pressurized against the conductor exposed part 39 while an outer circumferential surface of the board connecting part 45 is being held by a chuck or the like and being rotated about an axis, and thereby the conductor connecting face 49 is well friction-welded to the conductor exposed part 39. That is, the terminal main body 47 of the terminal member 17 has a circular cross-sectional shape, and thereby has a shape suitable for the friction welding.

An outer circumferential surface of the terminal main body 47 excluding the board connecting part 45 and the conductor connecting face 49 is coated with an insulating coating member 37. The insulating coating member 37 can use the same coating as the insulating coating member 37 with which the outer circumferential surface of the plate-like routing member 15 is coated. The insulating coating member of the terminal main body 47 is not limited to this coating.

The board connecting parts 45 of the terminal members 17 are electrically connected to terminal connecting parts 51 provided on the circuit conductors 21 formed on the circuit board 19. In the present embodiment, the terminal connecting parts 51 pass through the circuit board 19 illustrated in FIG. 1, and are formed as a first through-hole 53 and a second through-hole 55 that are conducted to the circuit conductors 21. The terminal connecting parts 51 are not limited to these through-holes. The board connecting parts 45 of the terminal members 17 which are inserted through the first through-hole 53 and the second through-hole 55 are soldered to the circuit conductors 21.

When the plurality of plate-like routing members 15 are stacked, as illustrated in FIG. 2, a terminal through-hole 57 through which the terminal member 17 (a first terminal member 59) connected to the lower layer plate-like routing member 15 (the first layer plate-like routing member 41) passes in a plate thickness direction is drilled in the upper layer plate-like routing member 15 (the second layer plate-like routing member 43). The first terminal member 59 connected to the plate-like routing member 15 disposed at the lower layer passes through the terminal through-hole 57 and protrudes to an upper surface of the upper layer plate-like routing member 15, so that it can be electrically connected to the circuit conductor 21 of the circuit board 19. In the present embodiment, the case of the two layers is illustrated in the figure by way of example, but the number of layers may be naturally three or more. In this case, the terminal through-hole 57 is formed in all the plate-like routing members 15 exclusive of the lowermost layer plate-like routing member 15. Thereby, plate-like routing members 15 of a plurality of layers can be electrically connected to the circuit board 19 in whole.

Next, a procedure for assembling the stacked routing body 11 and the branch box 13 with the conductor connection structure for plate-like routing members according to the present embodiment will be described.

Figure 5:
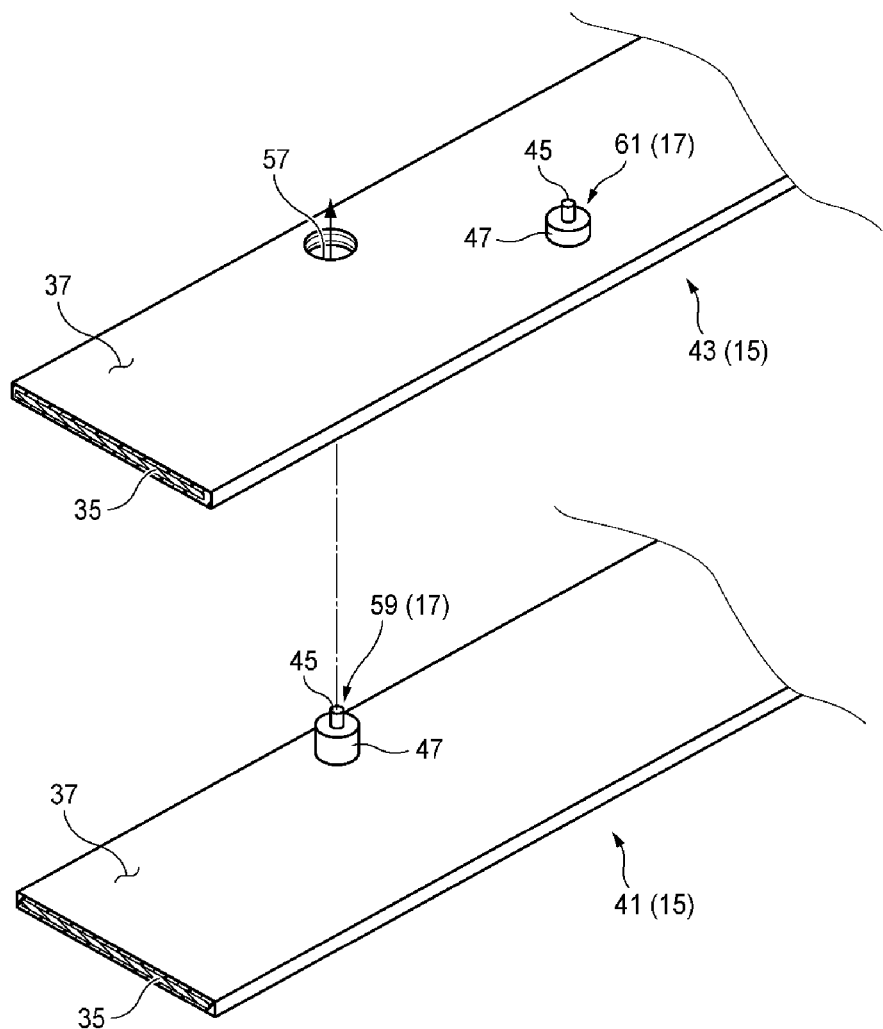
FIG. 5 is a perspective view of the plate-like routing members in which the terminal members are connected to flat conductors.
Figure 6:
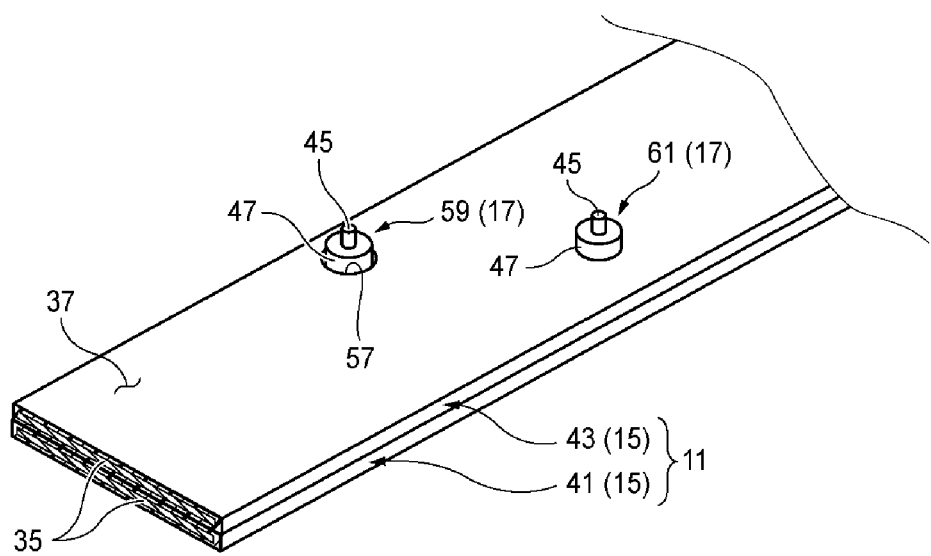
FIG. 6 is a perspective view of the stacked routing body in which the plurality of plate-like routing members illustrated in FIG. 5 are stacked.

FIG. 5 is a perspective view of the plate-like routing members 15 in which the terminal members 17 are connected to the flat conductors 35, and FIG. 6 is a perspective view of the stacked routing body 11 in which the plurality of plate-like routing members 15 illustrated in FIG. 5 are stacked.

To assemble the branch box 13 having the conductor connection structure for plate-like routing members according to the present embodiment, first, as illustrated in FIG. 5, the first terminal member 59 is connected to the conductor exposed part 39 of the first layer plate-like routing member 41, and a second terminal member 61 is also connected to the conductor exposed part 39 of the second layer plate-like routing member 43. The aforementioned terminal member 17 is a general term for the first terminal member 59 and the second terminal member 61. The first terminal member 59 is formed such that the terminal main body 47 thereof is higher than the second terminal member 61 by a thickness of the plate-like routing member 15 and the board connecting part 45 protruding to an upper surface of the circuit board 19 has the same length as that of the second terminal member 61.

In the present embodiment, the terminal through-hole 57 through which the first terminal member 59 passes is drilled in the second layer plate-like routing member 43 only.

Next, as illustrated in FIG. 6, the first layer plate-like routing member 41 and the second layer plate-like routing member 43 in which the terminal members 17 are connected to the respective flat conductors 35 are stacked. In this case, the plate-like routing members are stacked such that the first terminal member 59 of the first layer plate-like routing member 41 passes through the terminal through-hole 57 of the second layer plate-like routing member 43. The first layer plate-like routing member 41 and the second layer plate-like routing member 43 may be fixed by an adhesive material applied to surfaces that face each other. In addition, the first layer plate-like routing member 41 and the second layer plate-like routing member 43 may be fixed by an adhesive tape or a clamp member.

The first terminal member 59 of the first layer plate-like routing member 41 and the second terminal member 61 of the second layer plate-like routing member 43 are disposed on an upper surface of the stacked routing body 11, in which the first layer plate-like routing member 41 and the second layer plate-like routing member 43 are stacked, (an upper surface of the second layer plate-like routing member 43).

Figure 7:
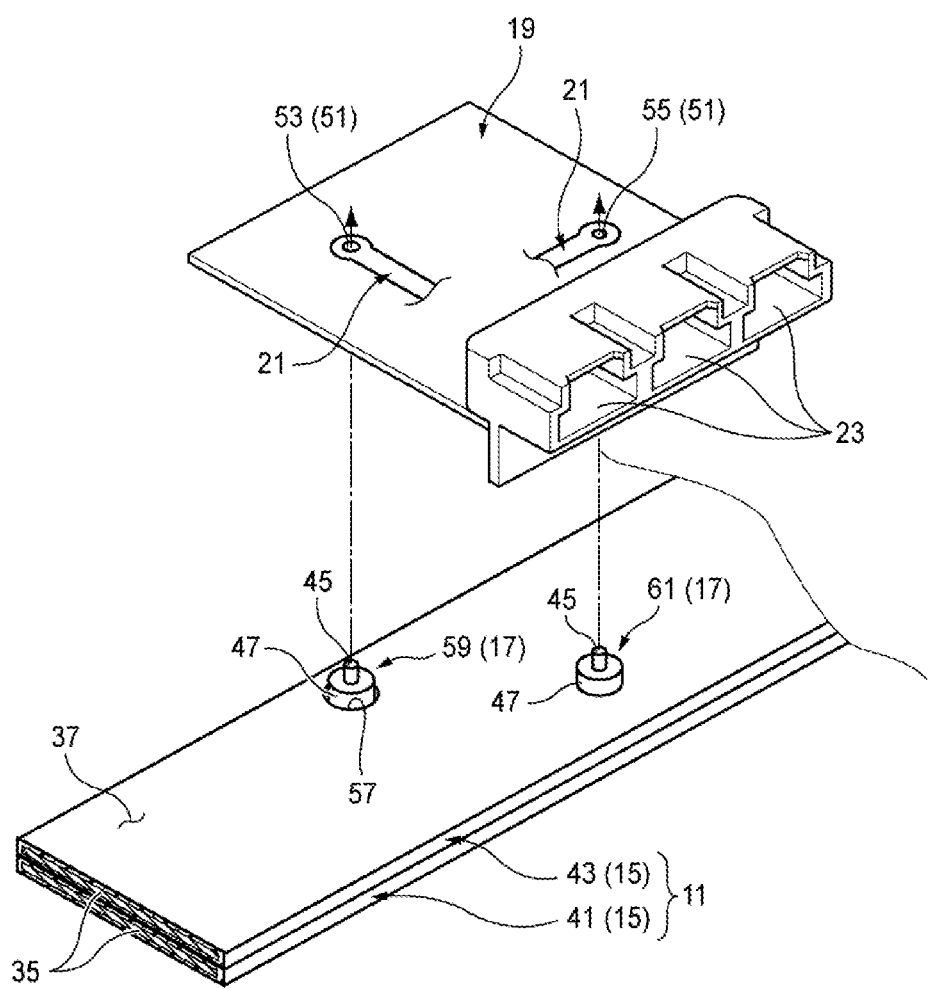
FIG. 7 is an exploded perspective view of the stacked routing body and a circuit board.

FIG. 7 is an exploded perspective view of the stacked routing body 11 and the circuit board 19.

Next, as illustrated in FIG. 7, the circuit board 19 is assembled to the stacked routing body 11, to the upper surface of which the pair of first and second terminal members 59 and 61 protrude. In the circuit board 19, the first terminal member 59 passes through the first through-hole 53 formed in the circuit conductor 21, and the second terminal member 61 passes through the second through-hole 55 formed in the circuit conductor 21.

Figure 8A:
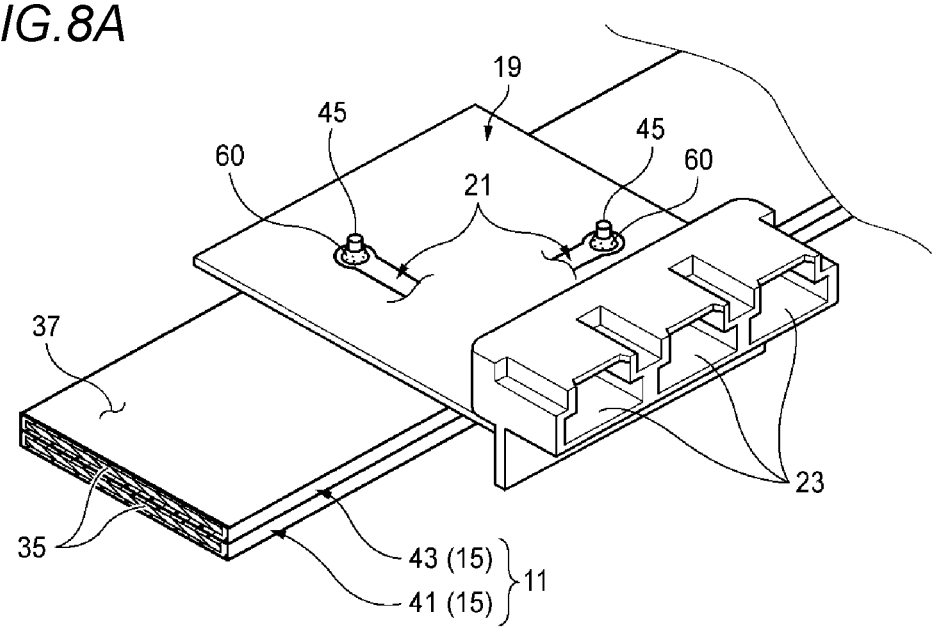
FIG. 8A is a perspective view of the stacked routing body and the circuit board that are electrically connected.
Figure 8B:
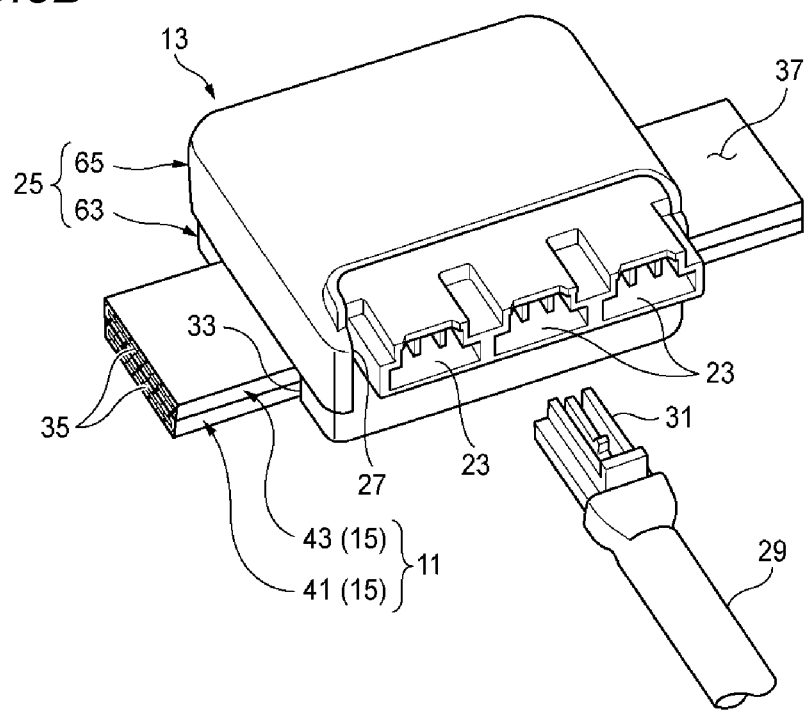
FIG. 8B is an exploded perspective view of the branch box, in which the circuit board connected to the stacked routing body is housed, and an auxiliary machine side wire.

FIG. 8A is a perspective view of the stacked routing body 11 and the circuit board 19 that are conductively connected, and FIG. 8B is an exploded perspective view of the branch box 13 in which the circuit board 19 connected to the stacked routing body 11 is housed, and the auxiliary machine side wire 29.

As illustrated in FIG. 8A, the board connecting part 45 of the first terminal member 59 inserted through the first through-hole 53 of the circuit board 19 and the board connecting part 45 of the second terminal member 61 inserted through the second through-hole 55 are soldered to the circuit conductors 21 by solder 60, and are conductively fixed. The circuit board 19 fixed to the midway of the stacked routing body 11 in an extending direction is housed in the box housing 25 of the branch box 13.

As illustrated in FIG. 8B, the box housing 25 houses the circuit board 19 in a sandwiched state by a lower housing 63 and an upper housing 65. In the box housing 25 in which the circuit board 19 is housed, the lower housing 63 and the upper housing 65 are fixed by fixing screws. The stacked routing body 11 is led out of a pair of routing member lead-out openings 33 of the branch box 13 in which the circuit board 19 is housed. Thereby, the assembly of the branch box 13 having the conductor connection structure for plate-like routing members according to the present embodiment is completed. In the assembled branch box 13, the auxiliary machine side connector 31 of the auxiliary machine side wire 29 is fitted into a predetermined edge conductor 23. Thereby, the branch box 13 having the conductor connection structure for plate-like routing members according to the present embodiment can be connected to an auxiliary machine at a desired position of the stacked routing body 11 with a small number of components.

Figure 9A:
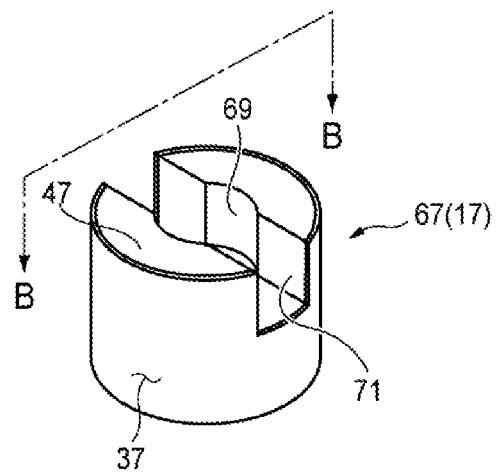
FIG. 9A is a perspective view of a terminal member according to a modification.
Figure 9B:
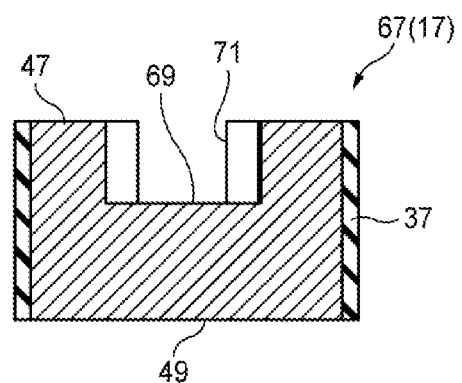
FIG. 9B is a sectional view taken along line B-B of FIG. 9A.

FIG. 9A is a perspective view of a terminal member 67 according to a modification, and FIG. 9B is a sectional view taken along line B-B of FIG. 9A.

The aforementioned terminal member 17 has been described as the male terminal by way of example. However, the terminal member 17 may be used as the terminal member 67 that is a female terminal illustrated in FIGS. 9A and 9B. The terminal member 67 includes a columnar terminal main body 47, and a conductor connecting face 49 is formed on a lower end face (one end face) of the terminal main body 47 in an axial direction. An outer circumferential surface of the terminal main body 47 is coated with an insulating coating member 37. In the terminal member 67, a pin fitting hole 69 is coaxially drilled in an upper end face (the other end face) of the terminal main body 47 in the axial direction as a board connecting part. A connecting pin or the like that is the terminal connecting part provided on the circuit conductor 21 of the circuit board 19 is fitted into the pin fitting hole 69. In the terminal member 67, a slit 71 that cuts across the pin fitting hole 69 in a radial direction is formed in the upper end face of the terminal main body 47 in the axial direction. The slit 71 facilitates expansion caused by elastic deformation of the pin fitting hole 69. The conductor connecting face 49 of the terminal member 67 is pressurized against the conductor exposed part 39 while a jig is being fitted into, for instance, the slit 71 and being rotated about an axis, and thereby the conductor connecting face 49 is well friction-welded to the conductor exposed part 39.

Next, an operation of the aforementioned configuration will be described.

In the conductor connection structure for plate-like routing members according to the present embodiment, the terminal member 17 is connected to the conductor exposed part 39 formed on one surface of the plate-like routing member 15. The terminal member 17 includes the board connecting part 45. The board connecting part 45 is conducted with the flat conductor 35 of the plate-like routing member 15.

Meanwhile, the circuit conductors 21 are formed on the circuit board 19 by printing or the like. The terminal connecting parts 51 (the first through-hole 53 and the second through-hole 55) electrically connected to the board connecting parts 45 are provided on the circuit conductors 21. In the plate-like routing members 15, the connected terminal members 17 are connected to the terminal connecting parts 51 of the circuit board 19, and thereby the flat conductors 35 are connected to the circuit conductors 21 via the board connecting parts 45 and the terminal connecting parts 51.

Therefore, the plate-like routing members 15 (for example, the wire harness trunk lines) and the circuit board 19 (for example, the circuit board housed in the box) can be directly connected without preparing the connectors as in the related art. That is, in the conductor connection structure for plate-like routing members according to the present embodiment, the board connecting parts 45 of the terminal members 17 only need to be electrically connected to the terminal connecting parts 51 of the circuit board 19 by inserting the plate-like routing members 15 to which the terminal members 17 are connected into the box. As a result, in comparison with a connection structure using the connectors of the related art, the number of components can be considerably reduced. Unlike the connection structure using the connectors in the related art, complicated work for which many man-hours are required, such as work of press-bonding a plurality of terminals to wire terminals and assembling these terminals to a housing, is not necessarily performed.

In the conductor connection structure for plate-like routing members according to the present embodiment, even when the plurality of plate-like routing members 15 (the first layer plate-like routing member 41 and the second layer plate-like routing member 43) are stacked, the terminal member 17 connected to the lower layer plate-like routing member 15 (the first layer plate-like routing member 41) passes through the terminal through-hole 57 provided in the upper layer plate-like routing member 15 (the second layer plate-like routing member 43) without coming into contact with the terminal through-hole 57. Thus, the terminal connecting part 51 connected to the lower layer the first layer plate-like routing member 41 can be exposed to the surface of the uppermost layer the second layer plate-like routing member 43. As a result, a plurality of circuits can be electrically connected without changing a dimension of each of the plate-like routing members 15 in a width direction.

By using the second layer plate-like routing member 43 in which the terminal through-hole 57 is previously drilled at a predetermined position, the plurality of terminal members 17 can be disposed at predetermined positions only by overlapping the first layer plate-like routing member 41 and the second layer plate-like routing member 43. As a result, work of connecting the first layer plate-like routing member 41 and the second layer plate-like routing member 43 to the circuit board 19 is simply performed.

In the conductor connection structure for plate-like routing members according to the present embodiment, the terminal main body 47 of the terminal member 17 is formed in a cylindrical shape or a columnar shape. The terminal member 17 can be rotated about an axis. One end face of the terminal member 17 in an axial direction serves as the conductor connecting face 49. With this configuration, the outer circumferential surface of the terminal member 17 can be held by a chuck or the like, and the terminal member 17 can be rotated about the axis. As a result, the conductor connecting face 49 of the terminal member 17 can be well friction-welded to the conductor exposed part 39.

Since the outer circumferential surface of the terminal member 17 is coated with the insulating coating member 37, the terminal member 17 is merely inserted through the terminal through-hole 57 when the plate-like routing members 15 are stacked without performing a separate insulating process, so that the contact with the flat conductor 35 of the upper layer plate-like routing member 15 can be prevented.

In the conductor connection structure for plate-like routing members according to the present embodiment, a terminal member whose outer circumferential surface is not coated with the insulating coating member 37 may also be used. In this case, to secure an insulation property between the first layer plate-like routing member 41 and the second layer plate-like routing member 43, an annular gap is formed between an inner circumferential surface of the terminal through-hole 57 of the second layer plate-like routing member (especially, an inner circumferential surface of the terminal through-hole of the flat conductor 35) and an outer circumferential surface of the terminal main body of the terminal member inserted through the terminal through-hole 57. To further secure the insulation property, an insulating member is preferably interposed in the annular gap. To do so, it is desirable to perform an insulating process such as a process of pouring an insulator into the annular gap or a process of fitting an insulating ring formed of rubber into the annular gap.

For example, the terminal through-hole 57 is drilled to pass through the strip flat conductor 35 in a plate thickness direction when the strip flat conductor 35 is punched, and then the insulating coating member 37 is formed on the outer circumferential surface of the flat conductor 35, so that the insulating coating member 37 can be provided on the outer circumferential surface of the flat conductor 35 and the inner circumferential surface of the terminal through-hole 57 at the same time.

Therefore, according to the conductor connection structure for plate-like routing members of the present embodiment, there is no need to prepare the connectors, and the number of components can be reduced.

The invention is not limited to the above embodiment. It is well expected in the invention that the components of the embodiment may be mutually combined or the embodiment may be modified or applied by those skilled in the art on the basis of the description of the specification and well-known techniques, and the combinations or the modifications or applications will fall within the scope to be protected.

For example, in the above embodiment, the case in which the terminal member 17 is subjected to intermetallic bonding to the flat conductor 35 by friction welding has been described by way of example. However, in the conductor connection structure for stacked routing body according to the invention, the terminal member may be connected to the flat conductor by another method, for instance, welding or a conductive adhesive material.

Here, the aforementioned features of the embodiment of the conductor connection structure for plate-like routing members according to the invention are briefly summarized and listed in [1] to [3] below.

[1] A conductor connection structure for a plurality of plate-like routing members comprising:
the plurality of plate-like routing members (15);
a plurality of terminal members (17); and
a circuit board (19),
wherein each of the plurality of plate-like routing members (15) has a conductor exposed part (39) in which a strip flat conductor (35) is exposed, at a part of an insulating coating member (37) coating an outer circumferential surface of the strip flat conductor (35),
wherein each of the plurality of the terminal members (17) has a board connecting part (45) connected to the conductor exposed part (39) so as to be conducted to the strip flat conductor (35), and
Wherein the circuit board (19) includes a plurality of circuit conductors (21), and terminal connecting parts (51) on the plurality of circuit conductors (21) are respectively electrically connected to the board connecting parts (45).

[2] The conductor connection structure for the plurality of plate-like routing members according to [1],
wherein the plurality of plate-like routing members (a first layer plate-like routing member (41) and a second layer plate-like routing member (43)) are stacked,
wherein a terminal through-hole (57) penetrated in a plate thickness direction is drilled in one of the plurality of plate-like routing members (the second layer plate-like routing member (43)) disposed at an upper layer; and
wherein the terminal member (a first terminal member (59)) connected to another of the plurality of plate-like routing members (the first layer plate-like routing member (41)) disposed at a lower layer passes through the terminal through-hole (57) and is electrically connected to one of the terminal connecting parts (a first through-hole 53) so that the plurality of plate-like routing members (the first layer plate-like routing member (41) and the second layer plate-like routing member (43)) are electrically connected via the circuit board (19).

[3] The conductor connection structure for the plurality of plate-like routing members according to [1] or [2],
wherein each of the plurality of terminal members (17 or 67) includes a columnar terminal main body (47) which has a conductor connecting face (49) in an axial direction connected to the conductor exposed part (39); and
Wherein an outer circumferential surface of each of the plurality of terminal main body (47) is coated with the insulating coating member (37).

DESCRIPTION OF REFERENCE NUMERALS AND SIGNS

15 Plate-like routing member
17 Terminal member
19 Circuit board

21 Circuit conductor
35 Flat conductor
37 Insulating coating member
39 Conductor exposed part
41 First layer plate-like routing member (plate-like routing member)
43 Second layer plate-like routing member (plate-like routing member)
45 Board connecting part
47 Terminal main body
49 Conductor connecting face
51 Terminal connecting part
53 First through-hole (terminal connecting part)
55 Second through-hole (terminal connecting part)
57 Terminal through-hole
59 First terminal member (terminal member)
61 Second terminal member (terminal member)

What is claimed is:

1. A conductor connection structure for a plurality of plate-like routing members comprising:
   the plurality of plate-like routing members;
   a plurality of terminal members; and
   a circuit board,
   wherein each of the plurality of plate-like routing members includes a strip flat conductor and an insulating coating member, the strip flat conductor has a rectangular cross-section and includes an upper surface, a lower surface, a left surface, and a right surface, and the insulating coating member covers each of the surfaces of the strip flat conductor except for a conductor exposed part in which the insulating coating member exposes a portion of the upper surface of the strip flat conductor,
   wherein each of the plurality of terminal members extends through the insulating coating member, terminates on the upper surface of the strip flat conductor, and has a board connecting part connected to the conductor exposed part so as to be conducted to the strip flat conductor, and
   wherein each of the plurality of terminal members includes a terminal main body which has a conductor connecting face connected to the conductor exposed part,
   wherein an outer peripheral surface of each of the plurality of terminal main body is coated with the insulating coating member,
   wherein only the conductor connecting face is connected to a conductor exposed part, and
   wherein the circuit board includes a plurality of circuit conductors, and terminal connecting parts on the plurality of circuit conductors are respectively electrically connected to the board connecting parts.

2. The conductor connection structure for the plurality of plate-like routing members according to claim 1,
   wherein the plurality of plate-like routing members are stacked,
   wherein a terminal through-hole penetrated in a plate thickness direction is drilled in one of the plurality of plate-like routing members disposed at an upper layer; and
   wherein the terminal member connected to another of the plurality of plate-like routing members disposed at a lower layer passes through the terminal through-hole and is electrically connected to one of the terminal connecting parts so that the plurality of plate-like routing member are electrically connected via the circuit board.

3. The conductor connection structure for the plurality of plate-like routing members according to claim 1, wherein the plurality of plate-like routing members are fixed together by an adhesive tape.

4. A conductor connection structure for a plurality of plate-like routing members comprising:
   the plurality of plate-like routing members;
   a plurality of terminal members; and
   a circuit board,
   wherein each of the plurality of plate-like routing members has a conductor exposed part in which a strip flat conductor is exposed, at a part of an insulating coating member coating an outer circumferential surface of the strip flat conductor,
   wherein each of the plurality of terminal members has a board connecting part connected to the conductor exposed part so as to be conducted to the strip flat conductor, and
   wherein each of the plurality of terminal members includes a columnar terminal main body which has a conductor connecting face on a lower end face in an axial direction connected to the conductor exposed part,
   wherein an outer circumferential surface of each of the plurality of terminal main body is coated with the insulating coating member,
   wherein only the conductor connecting face is connected to a conductor exposed part, and
   wherein the circuit board includes a plurality of circuit conductors, and terminal connecting parts on the plurality of circuit conductors are respectively electrically connected to the board connecting parts, and
   wherein only one of the plurality of plate-like routing members has a terminal through-hole.

5. The conductor connection structure for the plurality of plate-like routing members according to claim 1, wherein the terminal member connected to a first plate-like routing member passes through a terminal through-hole provided in a second plate-like routing member, without the terminal member coming into contact with the terminal through-hole.

* * * * *